(12) United States Patent
Yang et al.

(10) Patent No.: US 7,867,895 B2
(45) Date of Patent: Jan. 11, 2011

(54) METHOD OF FABRICATING IMPROVED INTERCONNECT STRUCTURE WITH A VIA GOUGING FEATURE ABSENT PROFILE DAMAGE TO THE INTERCONNECT DIELECTRIC

(75) Inventors: Chih-Chao Yang, Glenmont, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 11/858,166

(22) Filed: Sep. 20, 2007

(65) Prior Publication Data
US 2009/0079077 A1 Mar. 26, 2009

(51) Int. Cl.
*H01L 21/4763* (2006.01)

(52) U.S. Cl. ............... 438/643; 438/637; 438/672; 438/E23.141

(58) Field of Classification Search ......... 438/637–638, 438/672–673, 700, 618–624
See application file for complete search history.

(56) References Cited

U.S. PATENT DOCUMENTS

| | | | | |
|---|---|---|---|---|
| 7,276,796 B1 * | 10/2007 | Yang et al. | ............. | 257/751 |
| 7,498,254 B2 * | 3/2009 | Yang et al. | ............. | 438/618 |
| 7,528,066 B2 * | 5/2009 | Yang et al. | ............. | 438/645 |
| 7,566,975 B2 * | 7/2009 | Motoyama | ............. | 257/762 |
| 2002/0019123 A1 * | 2/2002 | Ma et al. | ............. | 438/622 |

* cited by examiner

*Primary Examiner*—Dung A. Le
(74) *Attorney, Agent, or Firm*—Scully, Scott, Murphy & Presser, P.C.; Wenjie Li

(57) ABSTRACT

An interconnect structure including a gouging feature at the bottom of the via openings and a method of forming the same, which does not introduce either damages caused by Ar sputtering into the dielectric material that includes the via and line openings, nor plating voids into the structure are provided. The method includes the uses of at least one infusion process that forms an infused surface region within a conductive material of a lower interconnect level. The infused surface region has a different etch rate as compared with the conductive material and thus in a subsequent etching process, the infused surface region can be selectively removed forming a gouging feature within the structure.

14 Claims, 12 Drawing Sheets

METHOD OF FABRICATING IMPROVED INTERCONNECT STRUCTURE WITH A VIA GOUGING FEATURE ABSENT PROFILE DAMAGE TO THE INTERCONNECT DIELECTRIC

FIELD OF THE INVENTION

The present invention relates to a semiconductor interconnect structure, and a method of fabricating the same. More particularly, the present invention relates to a semiconductor interconnect structure having improved reliability in which at least one via gouging feature is present without introducing profile damaged regions or plating voids to the structure. The present invention also provides a method of forming such an interconnect structure.

BACKGROUND OF THE INVENTION

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. Within a typical interconnect structure, metal vias run perpendicular to the semiconductor substrate and metal lines run parallel to the semiconductor substrate.

As millions and millions of devices and circuits are squeezed on a semiconductor chip, the wiring density and the number of metal levels are both increased generation after generation. In order to provide low RC for high signal speed, low k dielectric materials having a dielectric constant of less than silicon dioxide as well as copper-containing lines are becoming a necessity. The quality of thin metal wirings and studs formed by a conventional damascene process is extremely important to ensure yield and reliability. The major problem encountered in this area today is poor mechanical integrity of deep submicron metal studs embedded in low k dielectric materials, which can cause unsatisfied thermal cycling and stress migration resistance in interconnect structures. This problem becomes more severe when either new metallization approaches or porous low k dielectric materials are used.

To solve this weak mechanical strength issue while employing copper damascene and low k dielectric materials in an interconnect structure, a so called "via punch-through" technique has been adopted by the semiconductor industry. The via punch-thorough provides a via gouging feature (or anchoring area) within the interconnect structure. Such a via gouging feature is reported to achieve a reasonable contact resistance as well as an increased mechanical strength of the contact stud.

However, the argon sputtering technique (or other physical gaseous bombardment process) that is used to create via gouging features in the prior art not only removes the deposited liner material, e.g., TaN, from the trench (i.e., line opening) bottom, but also damages the low k dielectric material, specifically at the bottom of a line opening. That is a profile damaged region is created in the dielectric material at the bottom of the line opening during formation of the via gouging feature. Because of the requirement of creating the gouging feature, the final interconnect structure not only has poor liner coverage at the trench bottom, but severe damage has been introduced into the low k dielectric material from the Ar sputtering process. This becomes a major yield detractor and a reliability concern for advanced chip manufacturing.

The detailed processing steps of the existing prior art approach for via gouging are illustrated in FIGS. 1A-1E and are described herein below. Reference is first made to FIG. 1A which illustrates a prior art structure that is formed after dual damascene patterning of an upper interconnect level 108 which is located atop a lower interconnect level 100. The lower interconnect level 100 includes a first low k dielectric material 102 which includes a metallic, Cu, feature 104 therein. The lower interconnect level 100 is separated in part from the upper interconnect level 108 by a capping layer 106. The upper interconnect level 108 includes a second low k dielectric material 110 that includes both line 112 and via 114 openings located therein. A surface of the metallic feature 104 of the lower interconnect level 100 that is beneath the via opening 114 is exposed as is shown in FIG. 1A.

FIG. 1B shows the prior art structure of FIG. 1A after forming a diffusion barrier, e.g., TaN, 116 over all of the exposed surfaces. Argon sputtering, such as is shown in FIG. 1C, is then performed to clean the bottom horizontal surface within the via opening 114 and form a gouging feature (i.e., anchoring area) 118 into the metallic feature 104 of the lower interconnect level 100. The gouging feature 118 is employed to enhance the interconnect strength between the various interconnect levels shown. During the Ar sputtering process, the diffusion barrier 116 is removed from the bottom of each of the line openings 112, and dielectric damages 120 (which are indicated by circles in the second low k dielectric material 110) are formed at the bottom of each of the line openings 112. The dielectric damages 120, which can also be referred to as profile damaged regions, formed during the sputtering process are due to the inherent aggressive nature of prior art sputtering processes.

FIG. 1D shows the prior art structure of FIG. 1C after forming a metal liner layer, e.g., Ta, Ru, Ir, Rh or Pt, 122 on the exposed surfaces thereof. FIG. 1E illustrates the prior art structure after filling the line and via openings (112 and 114, respectively) with a conductive metal, e.g., Cu, 124 and planarization. As shown in FIG. 1E, the prior art structure has poor diffusion barrier 116 coverage (designated by reference numeral 126) at the bottom of the metallic filled lines and a feature-bottom roughness which is a result of the damages 120 formed into the second low k dielectric material 110. Both of these characteristics reduce the quality of the diffusion barrier 116 and degrade the overall wiring reliability. Moreover, both of the aforementioned characteristics result in the structure exhibiting a high-level of metal-to-metal leakage.

In an attempt to obviate the formation of profile damage within the line opening of an interconnect dielectric material during the formation of the via gouging feature, it is known in the prior art to replace the physical gaseous bombardment process with an isotropic etching technique. However, the isotropic profile from wet etching causes plating voids to be formed within the interconnect structure. Specifically, the plating voids are formed within the conductive material located adjacent to a via anchoring region that is created by wet etching. This prior art process is clearly illustrated in FIGS. 2A-2D. Specifically, FIG. 2A illustrates a prior art structure that is formed after dual damascene patterning of an upper interconnect level 108 which is located atop a lower interconnect level 100. The lower interconnect level 100 includes a first low k dielectric material 102 which includes a metallic, Cu, feature 104 therein. The lower interconnect level 100 is separated in part from the upper interconnect level 108 by a capping layer 106. The upper interconnect level 108 includes a second low k dielectric material 110 that includes both line 112 and via 114 openings located therein. A surface of the metallic feature 104 of the lower interconnect level 100 that is beneath the via opening 114 is exposed as is shown in FIG. 2A.

After providing the structure shown in FIG. 2A, a wet etching process is used to remove a portion of the metallic feature 104 that is exposed creating a via anchoring region 128 as illustrated in FIG. 2B. The via anchoring region 128 extends horizontally, i.e., isotropically, outward from the mouth of the via opening 114. In most cases, the horizontical etching rate along the Cu 104 and capping layer 106 interface is faster than the vertical etching rate within the Cu 104, which results in severe "undercut", i.e., spaces between Cu 104 and capping layer 106. FIG. 2C illustrates the structure after formation of a metal liner layer, e.g., Ta, Ru, Ir, Rh or Pt, 122 on the exposed surfaces thereof. FIG. 2D illustrates the prior art structure after filling the line and via openings (112 and 114, respectively) with a conductive metal, e.g., Cu, 124 and planarization. As shown in FIG. 2D, plating voids 130 are created in the metallic feature 104 that is located directly beneath the capping layer 106 in a region abutting the via opening 114.

The presence of the plating voids is also undesirable since they decrease the reliability of the resultant interconnect structure.

In view of the above, there is a need for providing a new and improved semiconductor interconnect structure which includes a via gouging feature, yet no profile damage is created in the interconnect dielectric material underneath the conductive line, and no plating voids are created in the interconnect structure as well.

SUMMARY OF THE INVENTION

The present invention provides an interconnect structure including a gouging feature at the bottom of the via openings and a method of forming the same, which does not introduce either damages caused by Ar sputtering into the dielectric material that includes the via and line openings, nor plating voids into the structure. The interconnect structure of the present invention has improved reliability as compared to conventional interconnect structures mentioned above.

In one aspect of the present invention, a method of fabricating an interconnect structure including a gouging feature at the bottom of the via openings, which does not introduce either damages caused by Ar sputtering into the dielectric material, nor plating voids into the structure is provided.

The inventive method includes:

providing an initial interconnect structure that includes a lower interconnect level comprising a first dielectric layer having at least one conductive material embedded therein, an upper interconnect level comprising a second dielectric having at least one via opening that exposes a portion of said at least one conductive material located atop said lower interconnect level, said lower and upper interconnect levels are separated in part by a dielectric capping layer, and a patterned hard mask on a surface of the said upper interconnect level;

forming at least an infused surface region within an exposed portion of said conductive material;

forming at least one line opening in said second dielectric material that extends above said at least one via opening;

selectively removing said infused surface region to form a gouging feature within said conductive material;

forming a diffusion barrier layer on all exposed surfaces; and filling said at least one line opening and at least one via opening with a second conductive material.

In yet another embodiment of the present invention, the method includes the steps of:

providing an initial interconnect structure that includes a lower interconnect level comprising a first dielectric layer having at least one conductive material embedded therein, an upper interconnect level comprising a second dielectric having at least one via opening that exposes a portion of said at least one conductive material located atop said lower interconnect level, said lower and upper interconnect levels are separated in part by a dielectric capping layer, and a patterned hard mask on a surface of the said upper interconnect level;

forming an interfacial metallic region and an infused surface region within an exposed portion of said conductive material;

forming at least one line opening in said second dielectric material that extends above said at least one via opening;

selectively removing said infused surface region to form a gouging feature within said conductive material;

forming a diffusion barrier layer on all exposed surfaces; and filling said at least one line opening and at least one via opening with a conductive material.

In addition to the above, the present invention also provides an interconnect structure that includes a gouging feature at the bottom of the via openings, which does not include either damages caused by Ar sputtering in the dielectric material, nor plating voids.

In general terms, the inventive interconnect structure comprises:

a lower interconnect level including a first dielectric material having at least one conductive material embedded therein;

a dielectric capping layer located on said first dielectric material and some, but not all, portions of the at least one conductive material; and an upper interconnect level including a second dielectric material having at least one conductively filled via and an overlying conductively filled line disposed therein, wherein said conductively filled via is in contact with said at least one conductive material in said lower interconnect level by a via gouging feature, said via gouging feature is spaced apart from said conductive material by an interfacial metallic region.

DETAILED DESCRIPTION OF THE INVENTION

The present invention, which provides an interconnect structure including a via gouging feature (i.e., anchored via bottom) without introducing profile damage or plating voids into the interconnect structure and a method of fabricating the same, will now be described in greater detail by referring to the following discussion and drawings that accompany the present application. The drawings of the present application, which are referred to herein below in greater detail, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, an interconnect structure including a gouging feature at the bottom of the via openings and a method of forming the same, which does not introduce either damages caused by Ar sputtering into the dielectric material that includes the via and line openings, nor plating voids into the structure are provided.

Figure 1A:
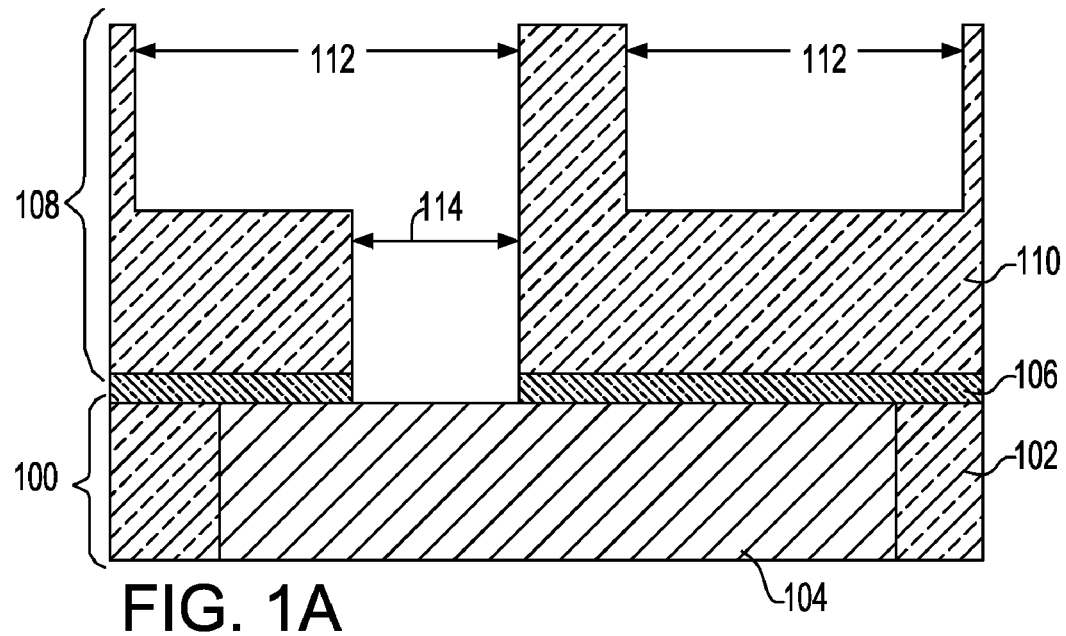
FIGS. 1A-1E are pictorial representations (through cross sectional views) depicting the basic processing steps used in the prior art for forming an interconnect structure including at least one via gouging feature.
Figure 1B:
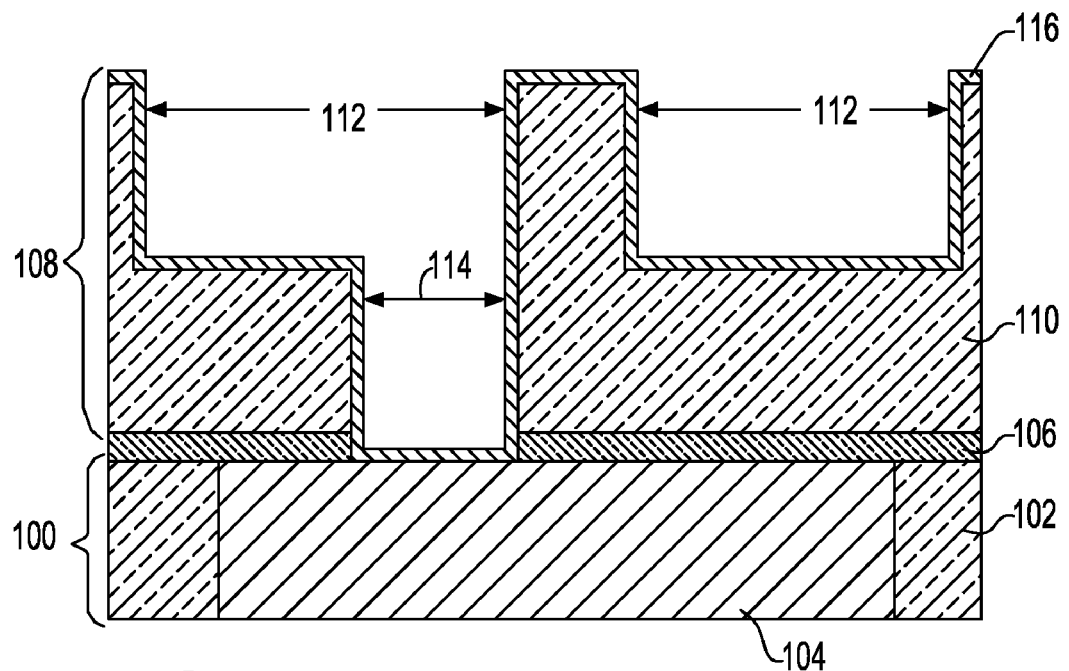
Figure 1C:
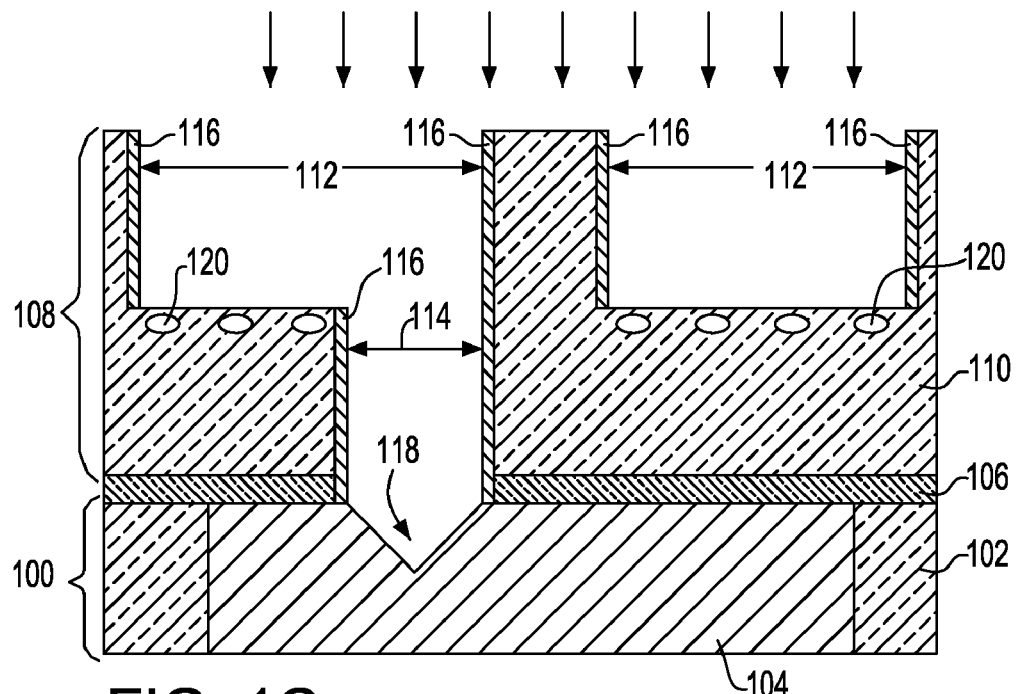
Figure 1D:
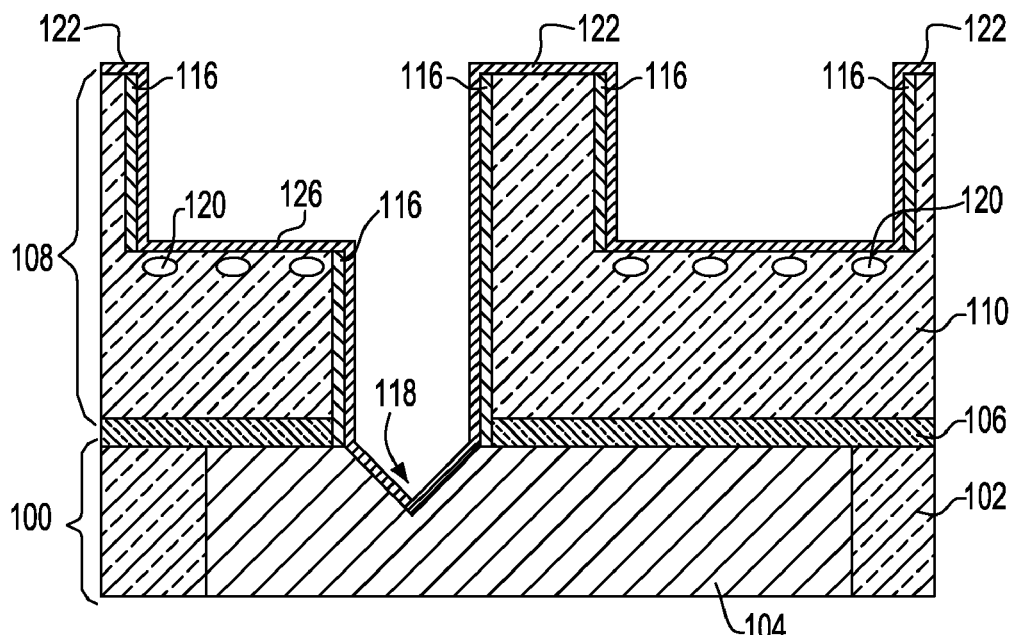
Figure 1E:
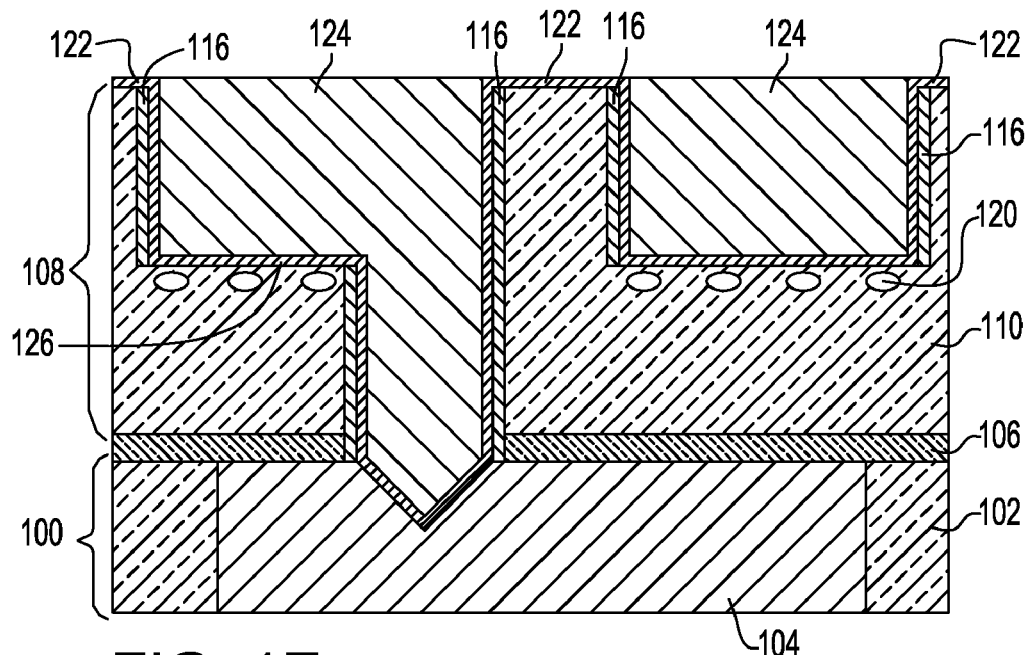
Figure 2A:
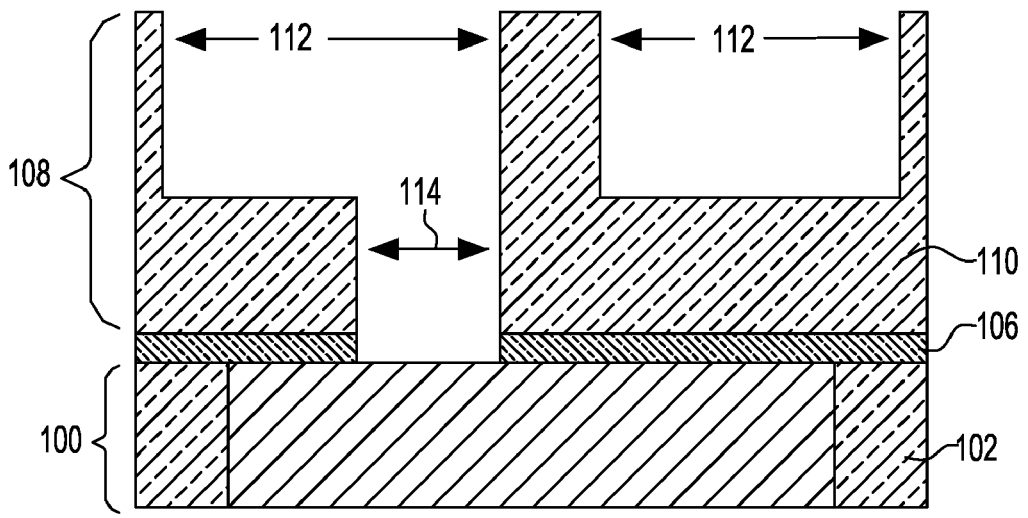
FIGS. 2A-2D are pictorial representations (through cross sectional views) depicting the basic processing steps used in the prior art for forming an interconnect structure including a via anchoring region created by wet etching.
Figure 2B:
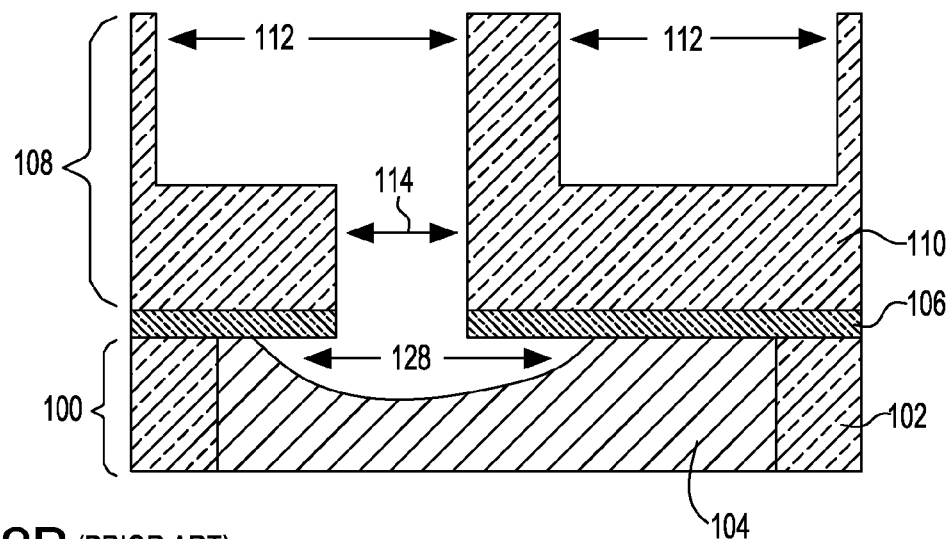
Figure 2C:
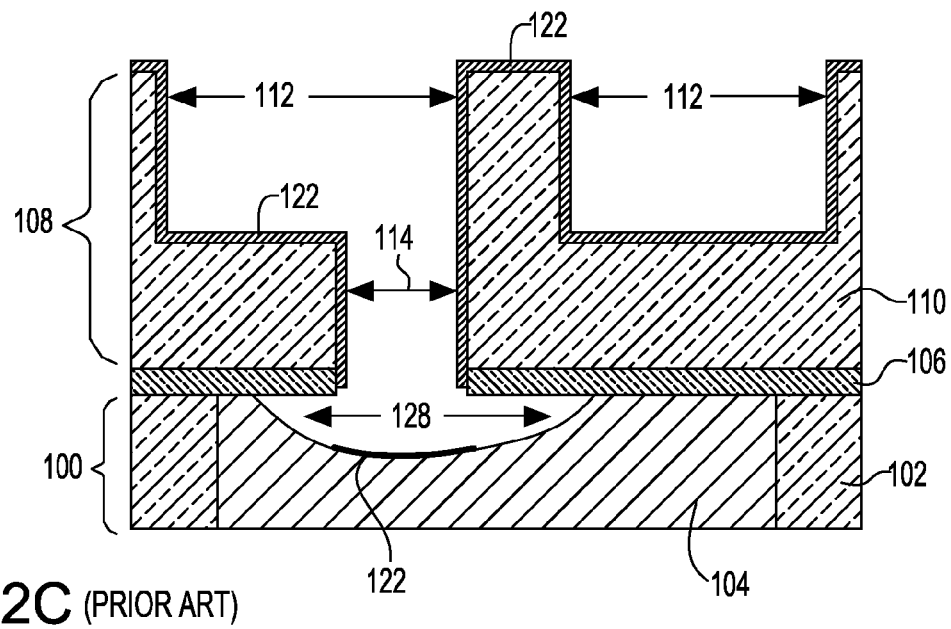
Figure 2D:
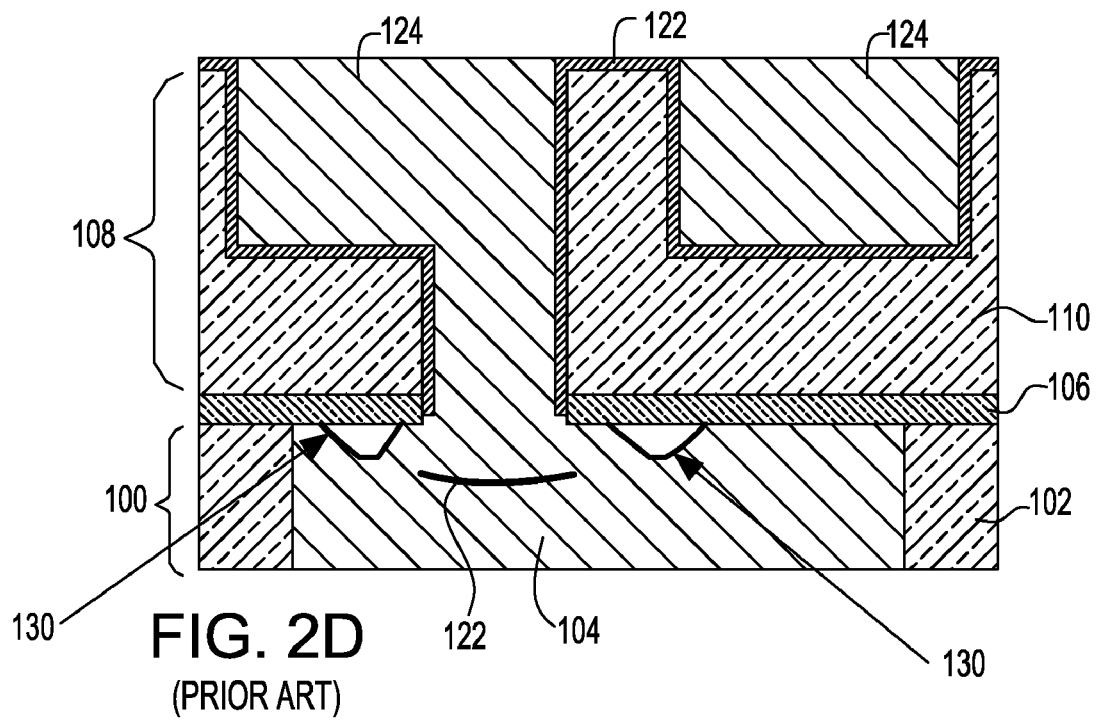
Figure 3:
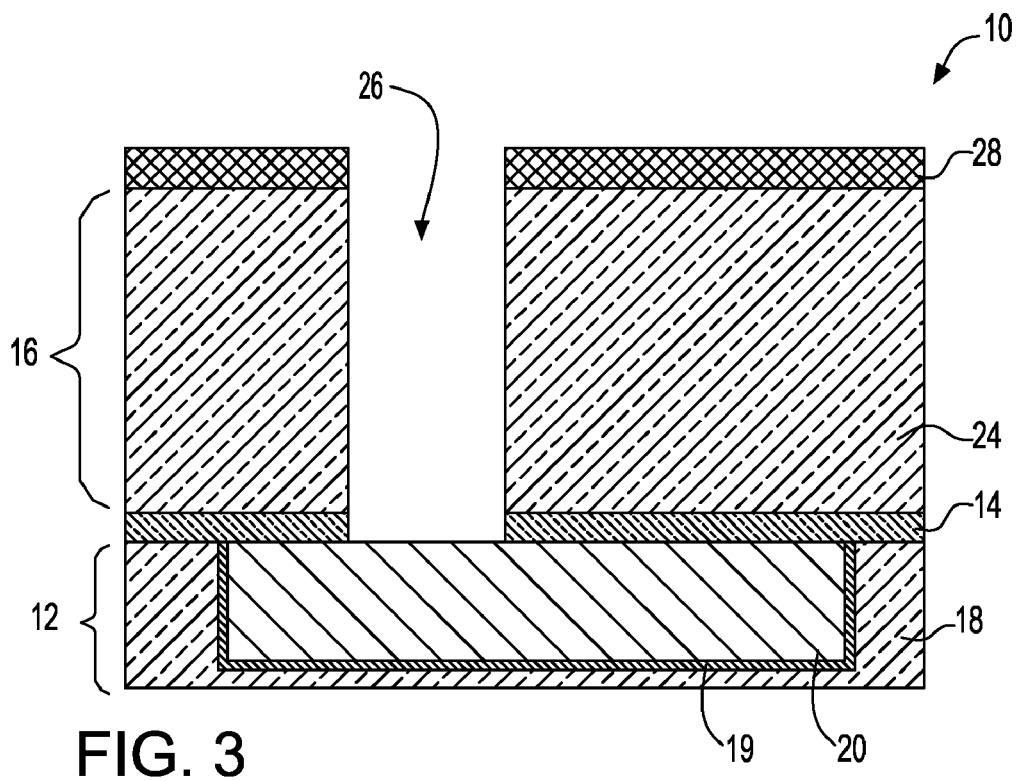
FIG. 3 is a pictorial representation (through a cross sectional view) illustrating an initial structure of the present invention after forming a via contact opening (herein after via opening) within an upper interconnect level.

The process flow of the present invention begins with providing the initial interconnect structure 10 shown in FIG. 3. Specifically, the initial interconnect structure 10 shown in FIG. 3 comprises a multilevel interconnect including a lower interconnect level 12 and an upper interconnect level 16 that are separated in part by a dielectric capping layer 14. The lower interconnect level 12, which may be located above a semiconductor substrate (not shown) including one or more semiconductor devices, comprises a first dielectric material 18 having at least one conductive material 20 (which forms a conductive region or feature embedded with the first dielectric material 18) that is separated from the first dielectric material 18 by a barrier layer 19. The upper interconnect level 16 comprises a second dielectric material 24 that has at least one via opening 26 located therein. As is shown, the at least one via opening 26 exposes a portion of the conductive material 20 present in the lower interconnect level 12. Atop the upper interconnect level 16 is a patterned hard mask 28. Although the structure shown in FIG. 3 illustrates a single via opening 26, the present invention contemplates forming any number of such via openings in the second dielectric material 24 which exposes other conductive features that may be present in the first dielectric material 18.

The initial structure 10 shown in FIG. 3 is made utilizing conventional techniques well known to those skilled in the art. For example, the initial interconnect structure can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous, with porous dielectrics having a dielectric constant of about 2.8 or less being highly preferred in some embodiments of the present invention. Some examples of suitable dielectrics that can be used as the first dielectric material 18 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The dielectric constants mentioned herein are measured in a vacuum. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive material 20 forming a conductive feature that is embedded in (i.e., located within) the first dielectric material 18. The conductive material 20 is separated from the first dielectric material 18 by a barrier layer 19. The conductive feature including the conductive material 20 is formed by lithography (i.e., applying a photoresist to the surface of the first dielectric material 18, exposing the photoresist to a desired pattern of radiation, and developing the exposed resist utilizing a conventional resist developer, etching (dry etching or wet etching) an opening in the first dielectric material 18 and filling the etched region with the barrier layer and then with a conductive material forming the conductive region. The barrier layer 19, which may comprise Ta, TaN, Ti, TiN, Ru, RuTaN, RuTa, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The barrier layer 19 may also comprise a bilayer barrier layer that includes a lower layer of a metallic nitride such as, for example, TaN and an upper metallic layer such as, for example, Ta.

The thickness of the barrier layer 19 may vary depending on the exact means of the deposition process as well as the material employed. Typically, the barrier layer 19 has a thickness from about 4 to about 40 nm, with a thickness from about 7 to about 20 nm being more typical.

Following the barrier layer 19 formation, the remaining region of the opening within the first dielectric material 18 is filled with a conductive material 20 forming the conductive feature. The conductive material 20 includes, for example, polySi, a conductive metal, an alloy comprising at least one conductive metal, a conductive metal silicide or combinations thereof. Preferably, the conductive material 20 is a conductive metal such as Cu, W or Al, with Cu or a Cu alloy (such as AlCu) being highly preferred in the present invention. The conductive material 20 is filled into the remaining opening in the first dielectric material 18 utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the barrier layer 19 and the conductive material 20 each have an upper surface that is substantially coplanar with the upper surface of the first dielectric material 18.

After forming the at least one conductive feature comprising the conductive material 20 within the first dielectric material 18, a blanket dielectric capping layer 14 is formed on the surface of the lower interconnect level 12 utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the capping layer 14 may vary depending on the technique used to form the same as well as the material make-up of the layer. Typically, the capping layer 14 has a thickness from about 15 to about 55 nm, with a thickness from about 25 to about 45 nm being more typical.

Next, the upper interconnect level 16 is formed by applying the second dielectric material 24 to the upper exposed surface of the capping layer 14. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. The second dielectric material 24 can also comprise two different materials, i.e., deposition of one dielectric material first, followed by deposition of a different dielectric material. In one embodiment of the present invention, the second dielectric material 24 comprises two different low k dielectric materials and thus the upper interconnect level 16 has a hybrid structure with the subsequently filled conductive line embedded in a porous dielectric material, and the subsequently filled via embedded in a dense (i.e., non porous) dielectric material. In such an embodiment, the porous low k dielectric has a dielectric constant of about 2.8 or less, and the dense porous low k dielectric has a dielectric constant of about 4.0 or less.

Next, at least one via opening 26 is formed into the second dielectric material 24 by first forming a blanket hard mask material atop the upper surface of the second dielectric material 24. The blanket hard mask material includes an oxide, nitride, oxynitride or any combination including multilayers thereof. Typically, the hard mask material is an oxide such as $SiO_2$ or a nitride such as $Si_3N_4$. The blanket hard mask material is formed utilizing a conventional deposition process such as, for example, CVD, PECVD, chemical solution deposition or evaporation. The thickness of the as-deposited hard mask material may vary depending upon the type of hard mask material formed, the number of layers that make up the hard mask material and the deposition technique used in forming the same. Typically, the as-deposited hard mask material has a thickness from about 10 to about 80 nm, with a thickness from about 20 to about 60 nm being even more typical.

After forming the blanket layer of hard mask material, a photoresist (not shown) is formed atop the hard mask material utilizing a conventional deposition process such as, for example, spin-on coating or chemical solution deposition. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the hard mask material that defines the width of the via opening 26.

After providing the patterned photoresist, the via pattern is transferred into the hard mask material and then subsequently into the second dielectric material 24 utilizing one or more etching process. The patterned photoresist can be stripped immediately after the via pattern is transferred into the hard mask forming patterned hard mask 28 utilizing a conventional stripping process. Alternatively, the patterned photoresist can be stripped after the via pattern is transferred into the second dielectric material 24. The etching used in transferring the via pattern may comprise a dry etching process, a wet chemical etching process or a combination thereof. The term "dry etching" is used herein to denote an etching technique such as reactive-ion etching, ion beam etching, plasma etching or laser ablation.

Figure 4A:
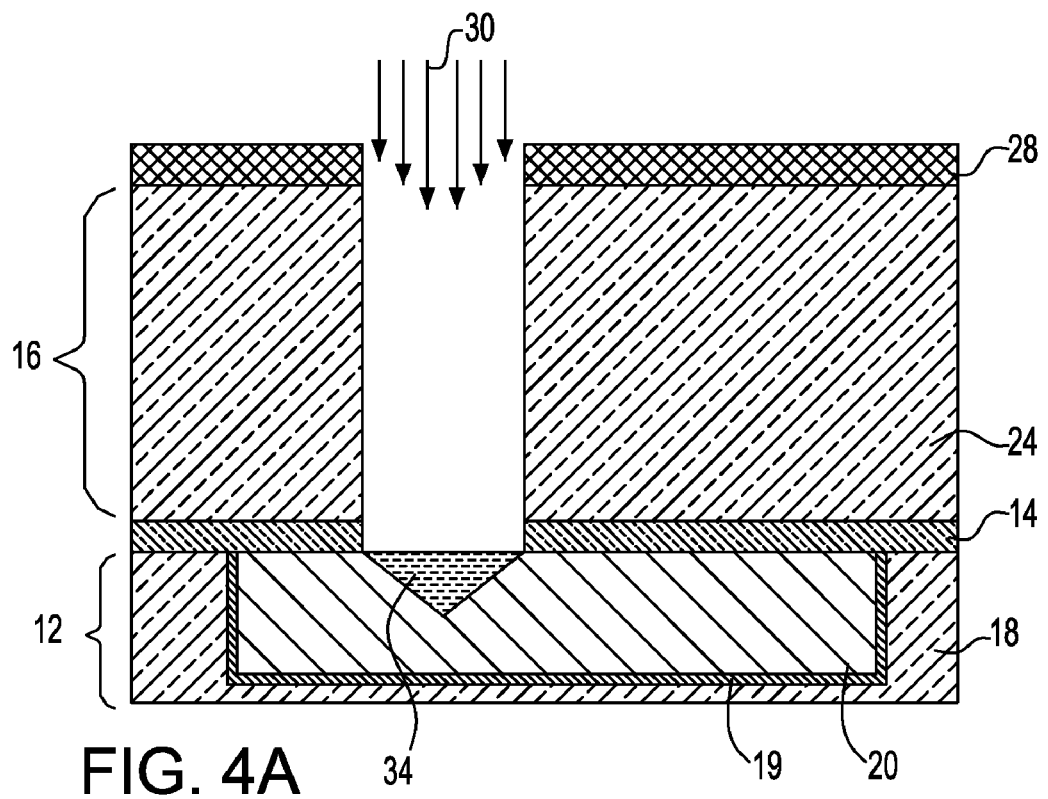
FIGS. 4A-4B are pictorial representations (through cross sectional views) of the structure shown in FIG. 3 after performing a single infusion processing step.
Figure 4B:
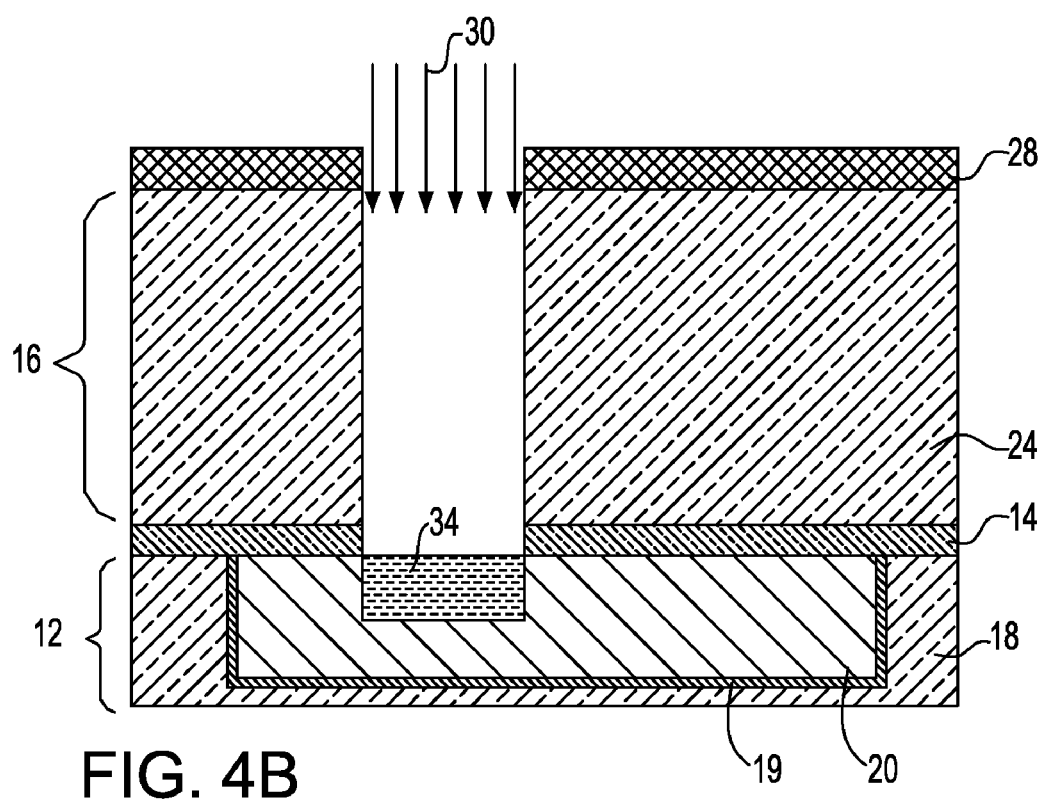
Figure 5A:
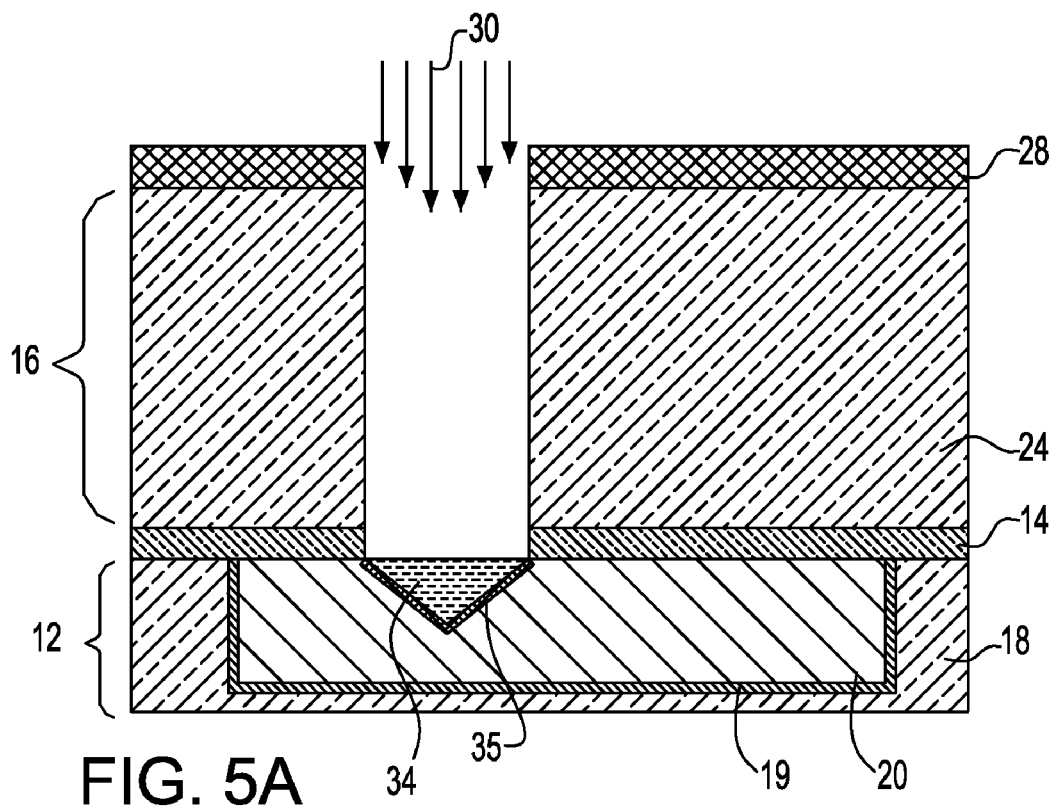
FIGS. 5A-5B are pictorial representations (through cross sectional views) of the structure shown in FIG. 3 after performing two separate infusion processing steps.
Figure 5B:
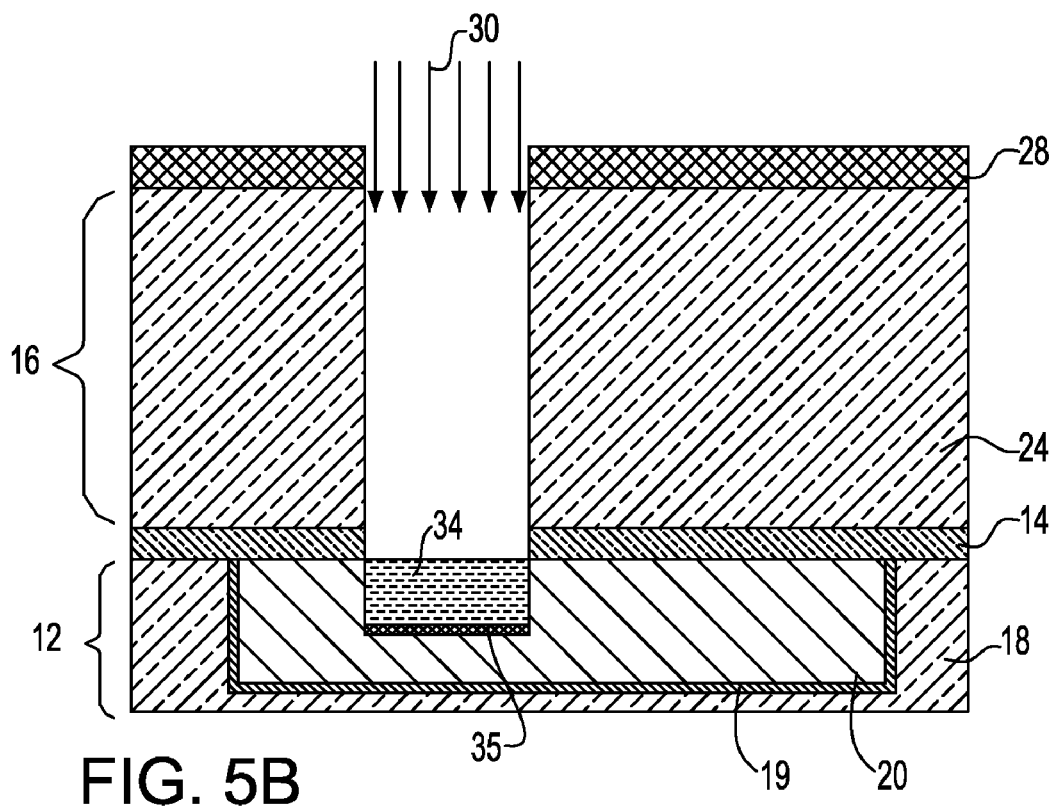

Reference is now made to the various structures that are shown in FIGS. 4A-4B. and 5A-5B. FIGS. 4A-4B represent an embodiment of the present invention in which a single infusion process is employed, while FIGS. 5A-5B illustrate another embodiment of the present invention in which two different infusion processes are used.

With respect to FIGS. 4A-4B, a single infusion process is employed in which at least one of oxygen, hydrogen, and nitrogen is incorporated into a surface portion of the conductive material 20 that is exposed by the via opening 24. The single infusion process incorporates one of the above species into a surface portion of the conductive material 20 forming an infused surface region that has a different composition, and hence a different etch rate as compared to the underlying conductive material. In FIGS. 4A and 4B, reference numeral 30 denotes the species being infused (i.e., incorporated) into the exposed portion of the conductive material 20 through via opening 24. Reference numeral 34 denotes the infused surface region that has a different etch rate as compared to the underlying conductive material 20. In FIG. 4A, the infusion process has higher density in the beam center and results in a cone shape of infused region into the underlying conductive material 20. On the other hand, the process infusion density is the same across the beam in FIG. 4B, which results in a flat-bottom shape of infused region into the underlying conductive material 20.

It is noted that the infused species reacts with the conductive material forming a surface region whose etch rate is different from the original conductive material. For example, when the conductive material 20 is Cu, the single infusion process may form $CuO_x$, $CuO_xH_y$, $CuO_xH_yN_z$ or an alloy of Cu.

The infused surface region 34 is formed by an infusion process such as, for example, gas cluster ion beam or ion implantation. Typically, the energy of the ion implantation process is from about 2 to about 50 keV, with a range from about 5 to about 30 keV being more typical. The shape of the infused surface region 34 is determined by the density of the species being infused into the conductive material 20. In FIG. 4A, the infused surface region 34 is in the shape of a triangle in which the base of the triangle is located at uppermost surface of the conductive region 20. In FIG. 4B, the infused surface region 34 has a rectangular shape. It is noted that the two shapes of the infused surface region 34 illustrated in the drawings are exemplary and, by no means, limit the scope of the present invention.

The infused surface region 34 shown in the drawings will be subsequently removed by a selective wet etching step forming a via gouging feature within the conductive material 20.

FIGS. 5A-5B illustrates other structures that can be formed utilizing a two step infusion process. In a first infusion step, an interfacial metallic specie is formed into the exposed portion of the conductive material. The interfacial metallic specie forms a region 35 that includes a metal such as Ta, Ir, Ru, Rh, Pt or Ti that reacts with a portion of the exposed conductive material 20. The interfacial metallic region 35 is formed by an infusion process such as, for example, metallic gas cluster ion beam or metal ion implantation. The conditions for the metal ion implantation may vary depending on the metal being implanted into the conductive material 20. Typical conditions are as described above. After forming the interfacial metallic region 35, another infusion process is performed with different specie that forms the infused surface region 34. The second infusion process includes the same infusion species as mentioned above in regard to the structures shown in FIGS. 4A-4B. It is noted that in the structures shown in FIGS. 5A-5B, the interfacial metallic region 35 is located between the infused surface region 34 and the conductive material 20. The interfacial metallic region 35 includes a metal such as Ta, IR, Ru, Rh, Pt or Ti that reacts with a portion of the conductive material 20. The infused surface region 34 contains $CuO_x$, $CuO_xH_y$, $CuO_xH_yN_z$ or an alloy of Cu when the conductive material 20 is Cu. Typically, the interfacial metallic region 35 has a different etch rate as compared to the infused surface region 34 and as such the interfacial metallic region 35 typically remains in the structure after performing a subsequent selective etching process.

It is noted that the following description of processing steps utilize the structure that is shown in FIG. 4A. Although this specific embodiment is utilized in the following processing steps, the other embodiments shown in FIGS. 4B-5B can also be subjected to the same processing steps which do not change when utilizing any of the alternative embodiments shown in FIG. 4B-5B. As such, FIG. 4A is used only for illustrative purposes and any of the structures provided in FIGS. 4A-5B can be processed utilizing the following processing steps.

Figure 6:
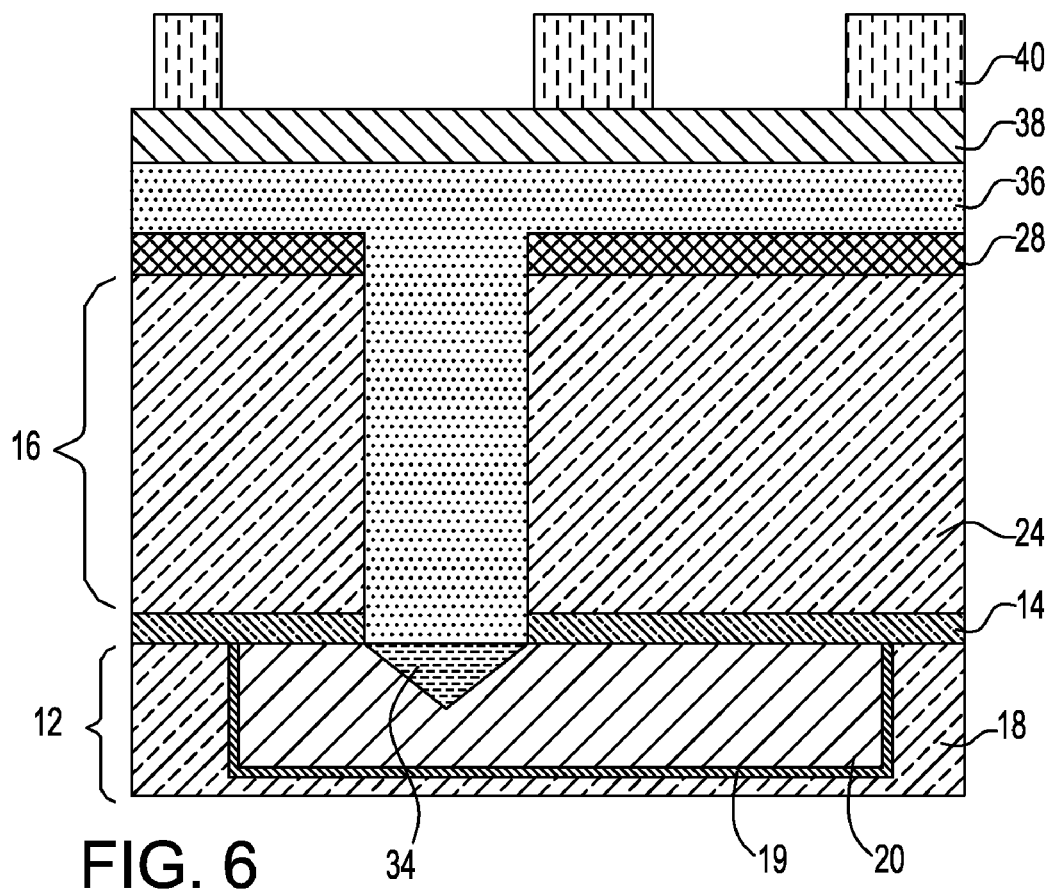
FIG. 6 is a pictorial representation (through a cross sectional view) of the structure shown in FIG. 4A after formation of a planarization layer, a second hard mask and a patterned photoresist.

Next, a planarization layer 36 is deposited filling the via opening 26 of the structure shown in FIG. 4A. The planarization layer 36 is deposited utilizing a conventional deposition process including, for example, spin-on coating or chemical solution deposition. The planarization material includes a conventional antireflective coating material or a spun-glass material. As shown in FIG. 6, the planarization layer 36 completes fills the via opening 26 as well as extending above the via opening 26 on the exposed surface of the hard mask 28.

In addition to the planarization layer 36, the structure shown in FIG. 6 also includes a second hard mask 38 disposed on a surface of the planarization layer 36 and a patterned photoresist 40 disposed on a surface of the second hard mask 38. The second hard mask 38 is formed utilizing the same processing techniques as described in forming the hard mask 28 and it is comprised of one of the hard mask materials mentioned above in connection with the hard mask 28. The patterned photoresist 40 is formed by deposition and lithography and it contains openings that have the width of a line opening.

Figure 7:
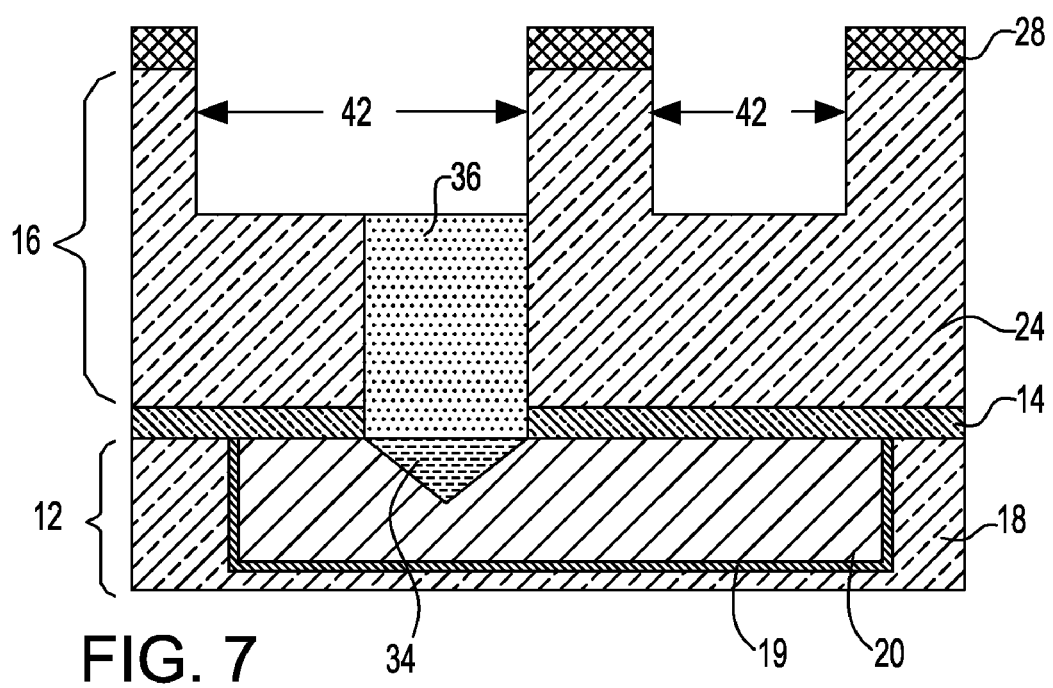
FIG. 7 is a pictorial representation (through a cross sectional view) of the structure shown in FIG. 6 after forming a line opening above the via opening and after partially removing the planarization layer from the structure.

The structure shown in FIG. 6 is then subjected to one or more etching processes which is capable of forming the structure shown in FIG. 7. As shown in this figure, the one or more etching processes forms line openings 42 in the second dielectric material 24. In accordance with the present invention, at least one of the line openings 42 is located above and connect to the via opening 26, which is protected by the remaining planarization layer 36. The one or more etching steps removes, in sequential order, exposed portions of the second hard mask 38, the underlying portions of the planarization layer 36, and exposed portions of the second dielectric material 24. The patterned photoresist 40 and the patterned second hard mask 38 are typically consumed during the above mentioned etching steps.

Figure 8:
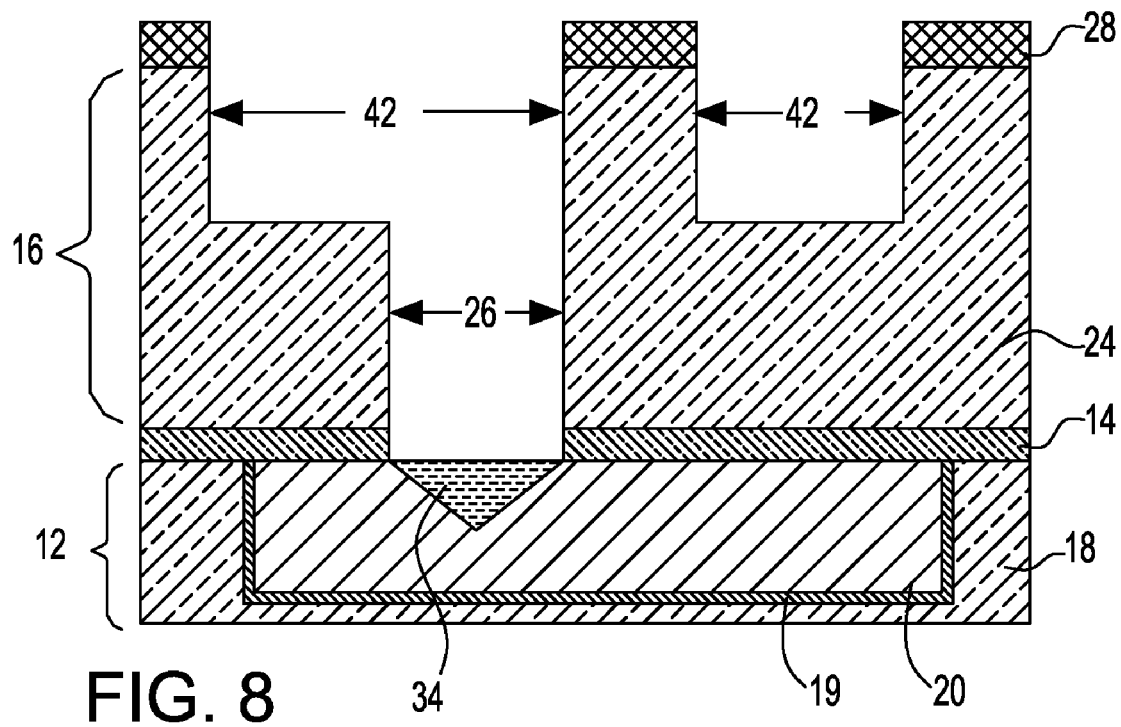
FIG. 8 is a pictorial representation (through a cross sectional view) of the structure shown in FIG. 7 after removing the remaining planarization layer from the structure.

FIG. 8 shows the structure of FIG. 7 after the remaining planarization layer 36 has been stripped from within the via opening 26. The stripping of the remaining planarization layer 36 is performed utilizing either a chemical wet etching process or a chemical ashing process that is selective in removing the planarizing material from the structure. As shown, the infused surface region 34 within the conductive material 20 is now exposed.

Figure 9:
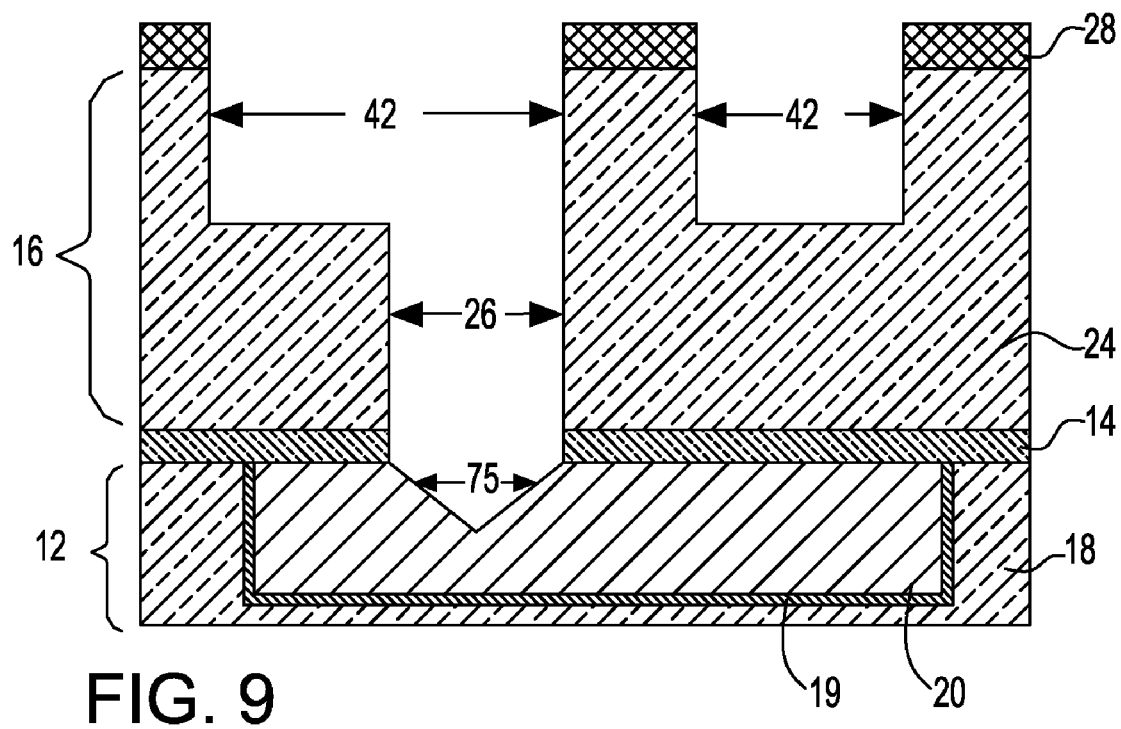
FIG. 9 is a pictorial representation (through a cross sectional view) of the structure shown in FIG. 8 after removing the infused surface region formed by the single infusion process step.

FIG. 9 illustrates the structure of FIG. 8 after performing an etching process that selectively removes the infused surface region 34 relative to the underlying conductive material 20. In embodiments in which the interfacial metallic region is present, the selective etching removes the infused surface region 34 stopping atop the interfacial metallic region. Examples of selective etching processes that can be used include a wet chemical etching process in which the chemical etchant is dilute HF or an alanine solution (i.e., an alpha-amino acid having the chemical formula $HO_2CCH(NH_2)CH_3$). It is noted that after removing the infused surface region 34, a via gouging feature (i.e., a via anchoring feature) 75 is created in the structure.

Figure 10:
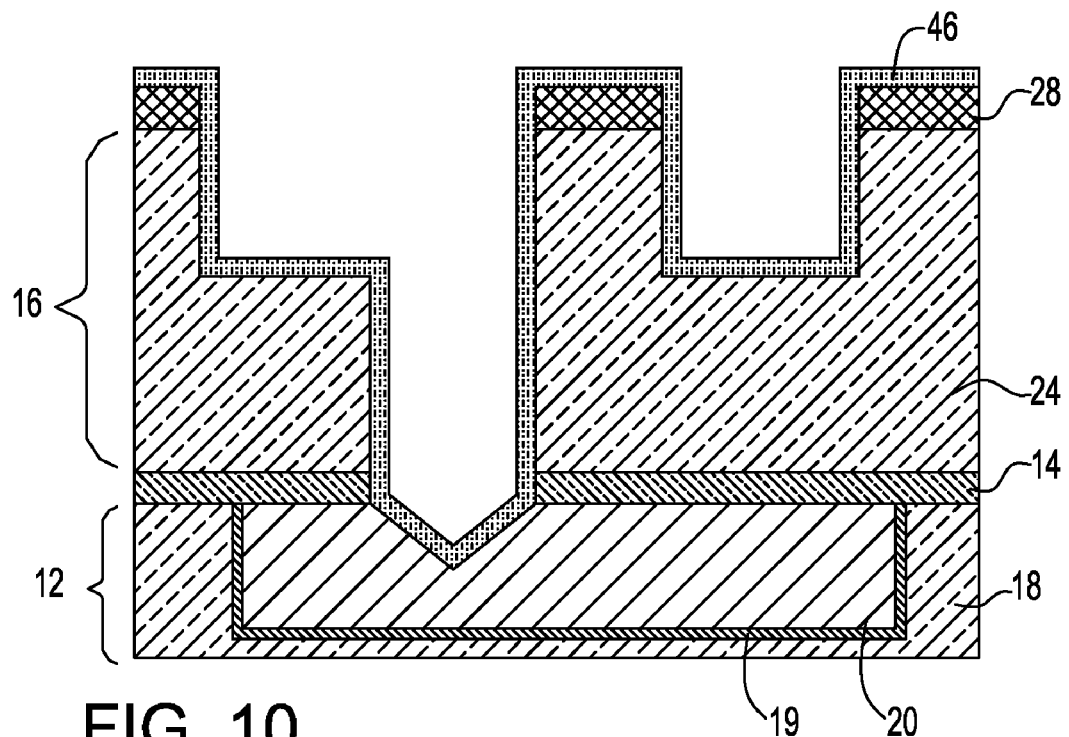
FIG. 10 is a pictorial representation (through a cross sectional view) of the structure shown in FIG. 9 after forming a diffusion barrier layer in the via and line openings.

FIG. 10 shows the structure including at least one diffusion barrier 46. An optional adhesion/plating seed layer (not shown) can be located atop the diffusion barrier 46. For the purposes of the claimed invention, the diffusion barrier 46 represents a second diffusion barrier. As shown in FIG. 10, the diffusion barrier 46 covers the exposed surfaces within the line openings 42, the via openings 26 and the via gouging feature 75. It is noted that the diffusion barrier 46 is continuously present in the line openings 42 throughout the inventive process.

In accordance with the present invention, the diffusion barrier 46 comprises Ta, TaN, Ti, TiN, Ru, RuN, RuTa, RuTaN, W, WN or any other material that can serve as a barrier to prevent a conductive material from diffusing there through. Combinations of these materials are also contemplated forming a multilayered stacked diffusion barrier. The diffusion barrier 46 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier 46 may vary depending on the number of material layers within the barrier, the technique used in forming the same as well as the material of the diffusion barrier itself. Typically, the diffusion barrier 46 has a thickness from about 4 to about 40 nm, with a thickness from about 7 to about 20 nm being even more typical.

The optional adhesion/plating seed layer is comprised of a metal or metal alloy from Group VIIIA of the Periodic Table of Elements. Examples of suitable Group VIIIA elements for the adhesion/plating seed layer include, but are not limited to: Ru, TaRu, Ir, Rh, Pt, Pd and alloys thereof. In some embodiments, it is preferred to use Ru, Ir or Rh as the adhesion/plating seed layer.

The adhesion/plating seed layer is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the adhesion/plating seed layer may vary depending on number of factors including, for example, the compositional material of the adhesion/plating seed layer and the technique that was used in forming the same. Typically, the adhesion/plating seed layer has a thickness from about 0.5 to about 10 nm, with a thickness of less than 6 nm being even more typical.

Figure 11:
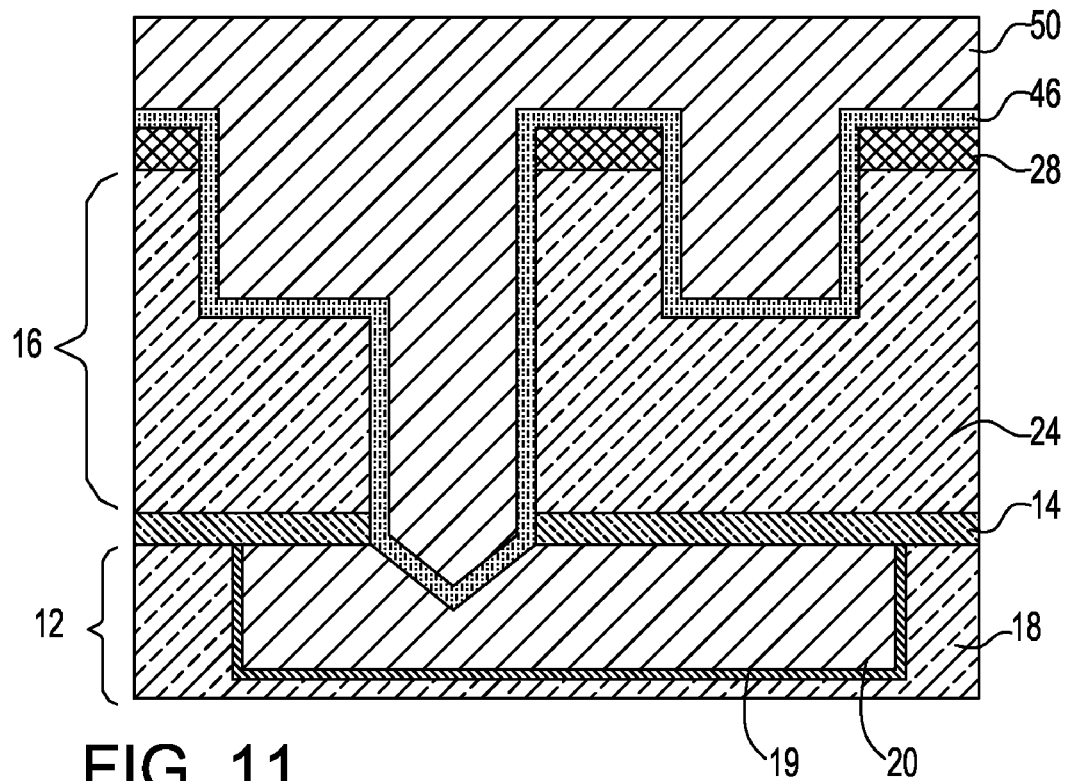
FIG. 11 is a pictorial representation (through a cross sectional view) of the structure shown in FIG. 10 after forming a conductive material within at least the via and line openings.

FIG. 11 illustrates the structure of FIG. 10 after filling the via and line openings as well as the gouging feature 75 with an interconnect conductive material 50 (i.e., second conductive material 50). The second conductive material 50 may comprise the same or different, preferably the same, conductive material as that of the conductive material 20 within the lower interconnect level. Preferably, Cu, Al, W or alloys thereof are used, with Cu or AlCu being most preferred. It is noted that when polysilicon is used as the conductive material, the adhesion/plating seed layer is typically not used; the adhesion plating seed layer mentioned above is typical used with the other types of conductive materials. The second conductive material 50 is formed utilizing the same deposition processing as described above in forming the conductive material 20. As shown, the second conductive material extends above the upper surface of the second dielectric material 24.

Figure 12:
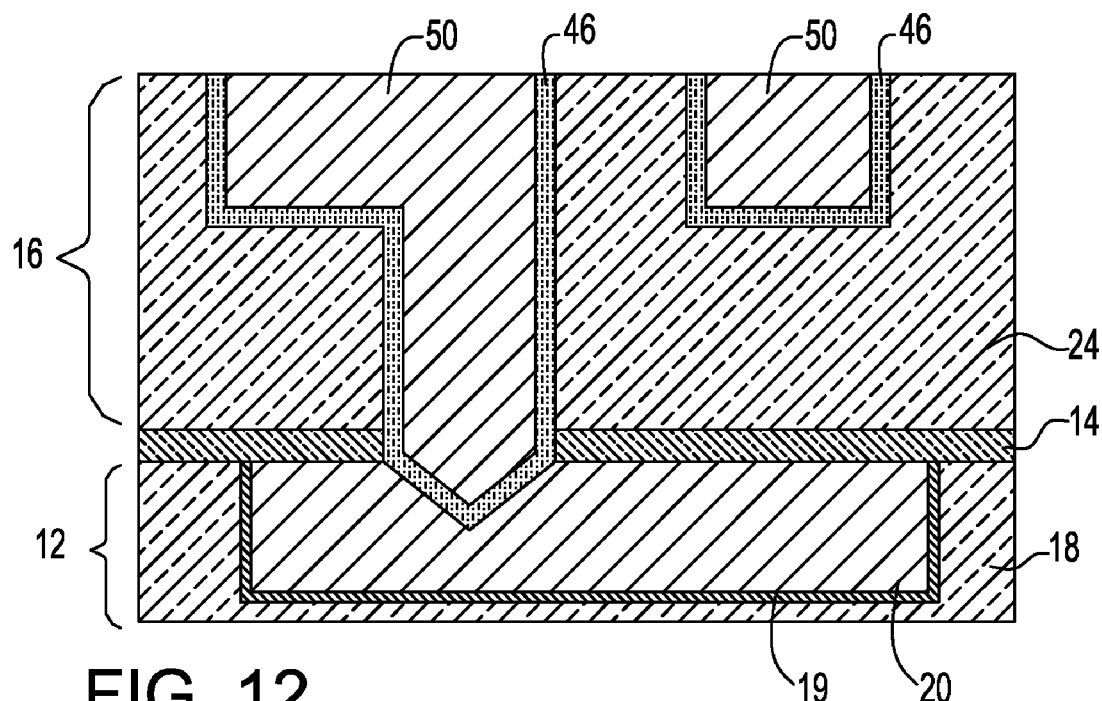
FIG. 12 is a pictorial representation (through a cross sectional view) of the structure shown in FIG. 11 after performing a planarization processing step.

Next, the structure shown in FIG. 11 is subjected to a planarization which provides the planar interconnect structure shown in FIG. 12. The planarization process removes various materials that are located atop the second dielectric material 24 of the upper interconnect level 16. Chemical mechanical polishing and/or grinding may be used in this step of the present invention.

Figure 13A:
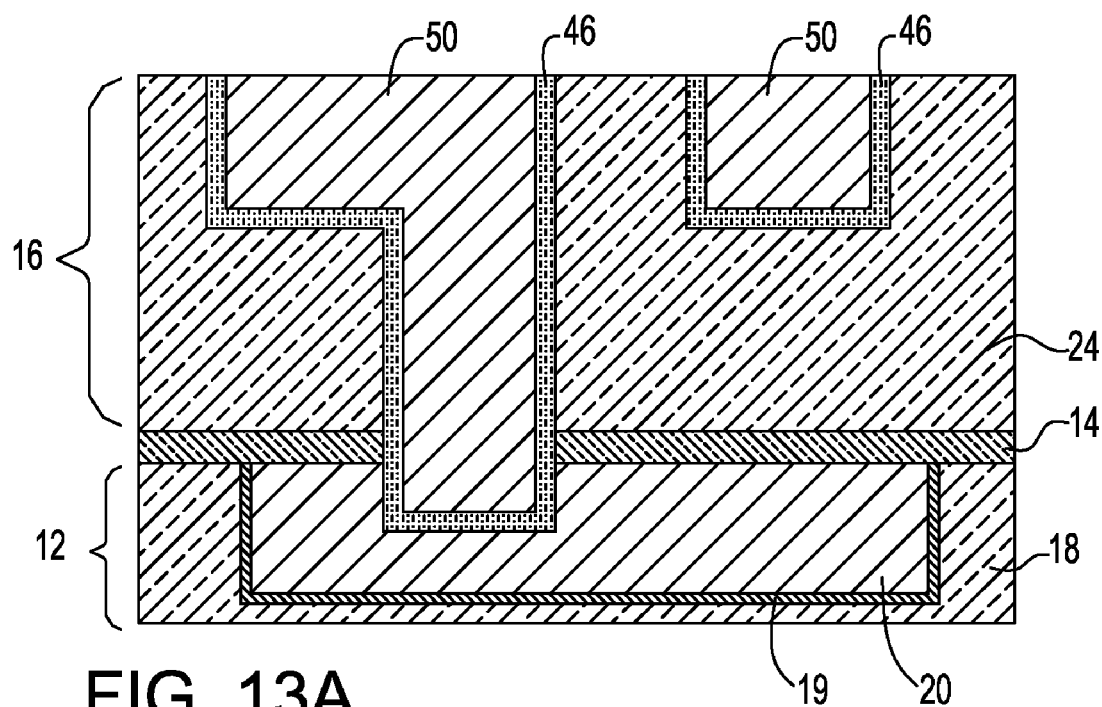
FIGS. 13A-13C are pictorial representations (through cross sectional views) of various embodiments of the present invention.
Figure 13B:
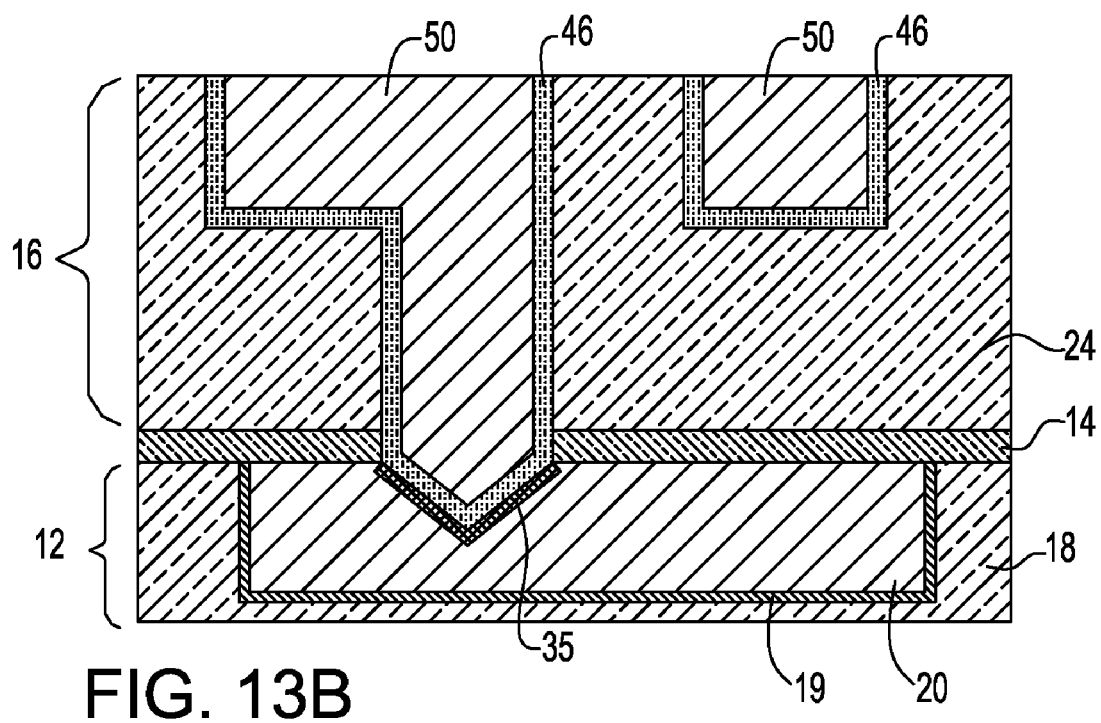
Figure 13C:
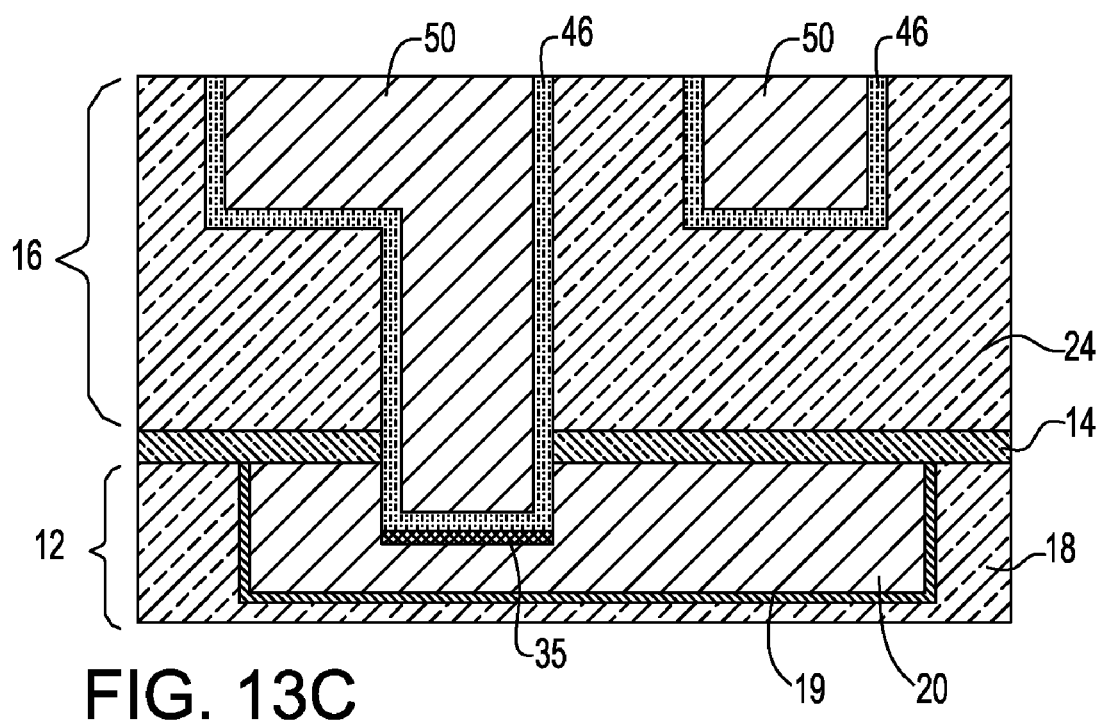

Reference is now made to FIGS. 13A-13C which illustrate the final interconnect structures that would be formed when the alternative structures previously shown in FIGS. 4B, 4A, and 5B, respectively were subjected to the processing steps shown in FIGS. 6-12.

The method of the present application is applicable in forming additional interconnect levels atop the levels depicted in FIGS. 3-13C. Each of the various interconnect levels would include the gouging feature described hereinabove.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating an interconnect structure comprising:
    providing an initial interconnect structure that includes a lower interconnect level comprising a first dielectric layer having at least one conductive material embedded therein, an upper interconnect level comprising a second dielectric having at least one via opening that exposes a portion of said at least one conductive material located atop said lower interconnect level, said lower and upper interconnect levels are separated in part by a dielectric capping layer, and a patterned hard mask on a surface of the said upper interconnect level;
    forming at least an infused surface region within an exposed portion of said conductive material;
    forming at least one line opening in said second dielectric material that extends above said at least one via opening;
    selectively removing said infused surface region to form a gouging feature within said conductive material;
    forming a diffusion barrier layer on exposed surfaces within at least one via opening, at least one line opening and at least said gouging feature; and
    filling said at least one line opening and at least one via opening with another conductive material.

2. The method of claim 1 wherein said providing said initial interconnect structure includes forming at least one conductive material within said first dielectric material, forming a blanket dielectric capping layer on said first dielectric material, forming said second dielectric material on said blanket dielectric capping layer, forming a patterned hard mask having via patterns on said second dielectric material, and transferring said via patterns into said second dielectric material and said blanket dielectric capping layer.

3. The method of claim 1 wherein said forming said infused surface region comprises incorporating an infused species that reacts with the conductive material to form the infused surface region which has a different etch rate as compared to the conductive material.

4. The method of claim 3 wherein said infused species includes one of oxygen, hydrogen and nitrogen.

5. The method of claim 3 wherein said incorporating comprises a gas cluster ion beam process, ion implantation or a combination thereof.

6. The method of claim 1 wherein said selectively removing said infused surface region comprises a wet chemical etching process including dilute HF or an alanine solution.

7. The method of claim 1 further comprising forming an interfacial metallic region within said conductive material prior to forming said infused surface region by gas cluster ion beam process or ion implantation Ta, Ru, Ir, Rh, Pt or Ir into the conductive material.

8. A method of fabricating an interconnect structure comprising:
  providing an initial interconnect structure that includes a lower interconnect level comprising a first dielectric layer having at least one conductive material embedded therein, an upper interconnect level comprising a second dielectric having at least one via opening that exposes a portion of said at least one conductive material located atop said lower interconnect level, said lower and upper interconnect levels are separated in part by a dielectric capping layer, and a patterned hard mask on a surface of the said upper interconnect level;
  forming an interfacial metallic region and an infused surface region within an exposed portion of said conductive material;
  forming at least one line opening in said second dielectric material that extends above said at least one via opening;
  selectively removing said infused surface region to form a gouging feature within said conductive material;
  forming a diffusion barrier layer on exposed surfaces within at least one via opening, at least one line opening and at least said gouging feature; and
  filling said at least one line opening and at least one via opening with another conductive material.

9. The method of claim 8 wherein said providing said initial interconnect structure includes forming at least one conductive material within said first dielectric material, forming a blanket dielectric capping layer on said first dielectric material, forming said second dielectric material on said blanket dielectric capping layer, forming a patterned hard mask having via patterns on said second dielectric material, and transferring said via patterns into said second dielectric material and said blanket dielectric capping layer.

10. The method of claim 8 wherein said forming said infused surface region comprises incorporating an infused species that reacts with the conductive material to form the infused surface region which has a different etch rate as compared to the conductive material.

11. The method of claim 10 wherein said infused species includes one of oxygen, hydrogen and nitrogen.

12. The method of claim 10 wherein said incorporating comprises a gas cluster ion beam process, ion implantation or a combination thereof.

13. The method of claim 8 wherein said forming said interfacial metallic region within said conductive material comprises gas cluster ion beam process or ion implantation Ta, Ru, Ir, Rh, Pt or Ir into the conductive material.

14. The method of claim 8 wherein said selectively removing said infused surface region comprises a wet chemical etching process including dilute HF or an alanine solution.

* * * * *